(12) United States Patent
Amanuma

(10) Patent No.: US 7,298,150 B2
(45) Date of Patent: Nov. 20, 2007

(54) TEST APPARATUS AND TEST METHOD

(75) Inventor: Seiji Amanuma, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/699,594

(22) Filed: Jan. 29, 2007

(65) Prior Publication Data
US 2007/0194794 A1 Aug. 23, 2007

(30) Foreign Application Priority Data
Feb. 2, 2006 (JP) ............................. 2006-025987

(51) Int. Cl.
*G01R 31/08* (2006.01)
*G01R 31/02* (2006.01)
*G01R 31/26* (2006.01)

(52) U.S. Cl. .................... 324/522; 324/763; 324/765

(58) Field of Classification Search ................ 324/522, 324/763, 765
See application file for complete search history.

(56) References Cited

U.S. PATENT DOCUMENTS 5,128,618 A * 7/1992 Yamada et al. ............. 324/501
5,392,293 A * 2/1995 Hsue ......................... 324/765

* cited by examiner

*Primary Examiner*—Walter Benson
*Assistant Examiner*—Amy He
(74) *Attorney, Agent, or Firm*—Osha Liang LLP

(57) ABSTRACT

Change in power supply voltage supplied to a device under test is controlled. There is provided a test apparatus for testing a device under test, the test apparatus including: a reference voltage supply section for supplying a reference voltage; a field effect transistor provided between a positive side terminal and a negative side terminal of the reference voltage supply section, so that a drain terminal and a source terminal of the field effect transistor are in parallel connection with the device under test; an inductance that is connected between the positive side terminal and the negative side terminal of the reference voltage supply section, the inductance being in serial connection with the device under test between a positive-side power supply terminal and a negative-side power supply terminal of the device under test, and being in serial connection with the field effect transistor between the drain terminal and the source terminal of the field effect transistor; a control section for controlling a gate voltage of the field effect transistor, thereby changing a power supply voltage to be supplied to the device under test; and a judgment section for judging quality of the device under test, based on characteristic of the device under test in accordance with change in the power supply voltage.

5 Claims, 5 Drawing Sheets

TEST APPARATUS AND TEST METHOD

CROSS REFERENCE TO RELATED APPLICATION

The present application claims priority from a Japanese Patent Application No. 2006-025987 filed on Feb. 2, 2006, the contents of which are incorporated herein by reference.

BACKGROUND

1. Technical Field

The present invention relates to a test apparatus and a test method. In particular, the present invention relates to a test apparatus and a test method for testing characteristic of a device under test by changing a power supply voltage.

2. Related Art

Semiconductor devices having high withstand voltage (hereinafter high withstand voltage semiconductor devices) are known to be used for controlling motors of electric cars and for controlling alternate current fan motors, for example. In such a high withstand voltage semiconductor device, PN conjunction is separated by means of an insulating film of $SiO_2$ for example, and so it is possible to incorporate circuits operating under low voltages and circuits operating under high voltages onto one chip.

Since insulating portions of high withstand voltage semiconductor devices contain capacitance, a defect may possibly occur attributable to a size of the gradient of the rising of a power supply voltage for example. In view of this, chances are that a defect may be detected when the gradient of the rising of the power supply voltage is larger than a predetermined value, while a defect may not be detected when the gradient is the predetermined value or smaller. Accordingly, a test apparatus is desired which is able to detect a defect attributable to a size of a gradient of the rising of a power supply voltage.

However, when testing a high withstand voltage semiconductor device, it is hard for a test apparatus to control the gradient of the rising of a power supply voltage to be supplied because the power supply voltage to be supplied is high.

SUMMARY

In view of this, an advantage of the present invention is to provide a test apparatus and a test method that are able to solve the foregoing problems. This advantage is achieved by combinations of features described in the independent claims. The dependent claims define further advantageous and exemplary combinations of the present invention.

So as to solve the foregoing problems, according to the first aspect of the present invention, there is provided a test apparatus for testing a device under test, the test apparatus including: a reference voltage supply section for supplying a reference voltage; a field effect transistor provided between a positive side terminal and a negative side terminal of the reference voltage supply section, so that a drain terminal and a source terminal of the field effect transistor are in parallel connection with the device under test; an inductance that is connected between the positive side terminal and the negative side terminal of the reference voltage supply section, the inductance being in serial connection with the device under test between a positive-side power supply terminal and a negative-side power supply terminal of the device under test, and being in serial connection with the field effect transistor between the drain terminal and the source terminal of the field effect transistor; a control section for controlling a gate voltage of the field effect transistor, thereby changing a power supply voltage to be supplied to the device under test; and a judgment section for judging quality of the device under test, based on characteristic of the device under test in accordance with change in the power supply voltage.

The judgment section may judge the quality of the device under test, based on a power supply current value consumed by the device under test when the power supply voltage is changed. The control section may decrease the gate voltage, thereby increasing the power supply voltage with a gradient designated in advance.

The control section conducts a first test in which the power supply voltage is raised from a first power supply voltage to a second power supply voltage while keeping the first reference voltage supplied from the reference voltage supply section, and on condition that no defect for the device under test is found in the first test, the control section conducts a second test in which the power supply voltage is raised from a voltage value substantially the same as a voltage value of the first power supply voltage to a third power supply voltage that is higher than the second power supply voltage, while keeping the second reference voltage supplied from the reference voltage supply section, the second reference voltage being higher than the first reference voltage.

According to the second aspect of the present invention, there is provided a test method for testing a device under test by means of a test apparatus, the test apparatus including: a reference voltage supply section for supplying a reference voltage; a field effect transistor provided between a positive side terminal and a negative side terminal of the reference voltage supply section, so that a drain terminal and a source terminal of the field effect transistor are in parallel connection with the device under test; and an inductance that is connected between the positive side terminal and the negative side terminal of the reference voltage supply section, the inductance being in serial connection with the device under test between a positive-side power supply terminal and a negative-side power supply terminal of the device under test, and being in serial connection with the field effect transistor between the drain terminal and the source terminal of the field effect transistor, the test method including: a control step for controlling a gate voltage of the field effect transistor, thereby changing a power supply voltage to be supplied to the device under test; and a judgment step for judging quality of the device under test, based on characteristic of the device under test in accordance with change in the power supply voltage.

The summary of the invention does not necessarily describe all necessary features of the present invention. The present invention may also be a sub-combination of the features described above.

DESCRIPTION OF EXEMPLARY EMBODIMENTS

As follows, the present invention is described based on some embodiments that do not intend to limit the scope of the present invention. All of the features and combinations thereof disclosed in the following are not necessarily essential to means provided by the aspects of the invention.

Figure 1:
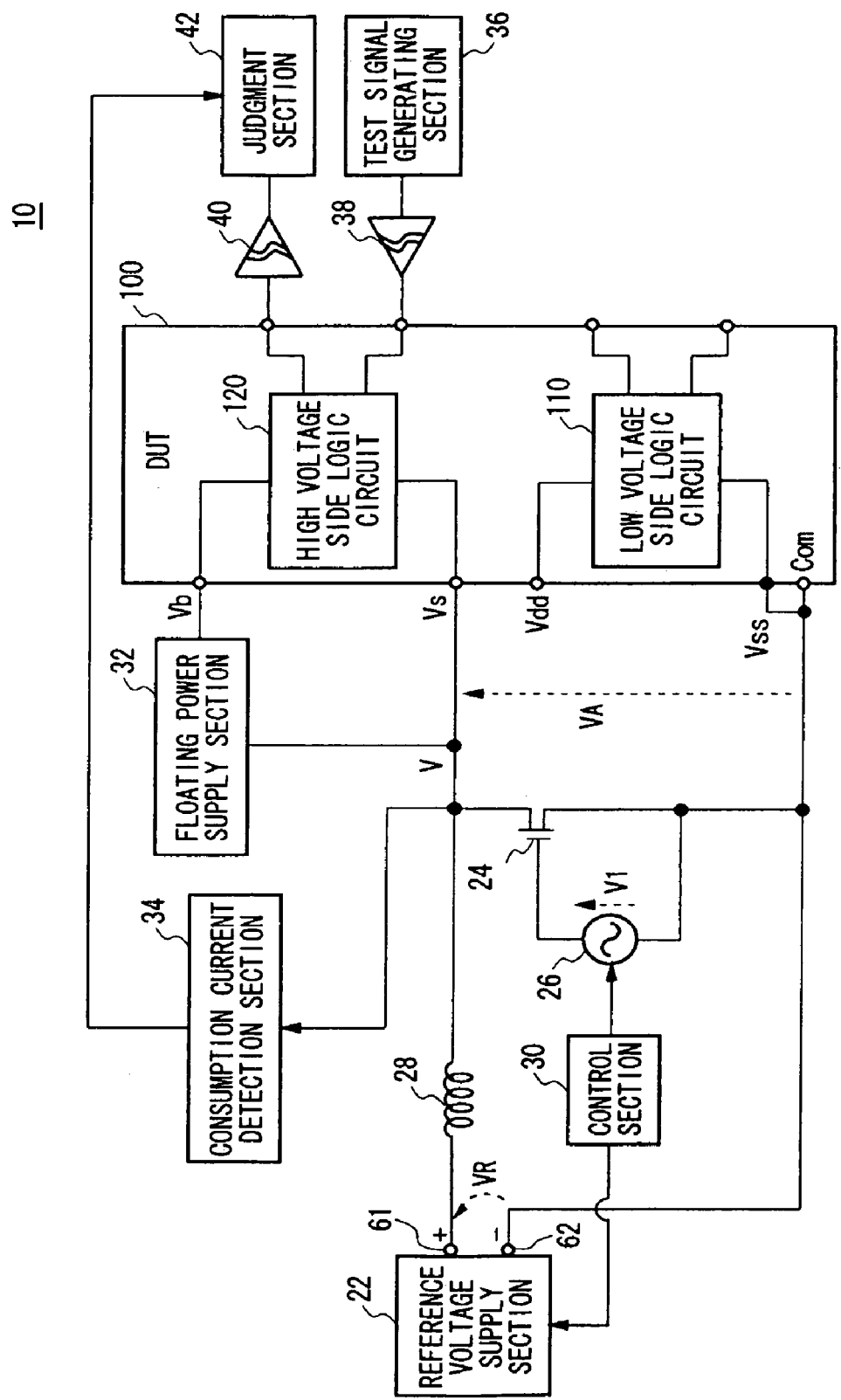
FIG. 1 is a diagram showing a test apparatus 10 according to an embodiment of the present invention, together with a device under test 100.

FIG. 1 shows a test apparatus 10 according to the present embodiment, together with a device under test (hereinafter referred to as "DUT 100"). The DUT 100 may include a low voltage side logic circuit 110 and a high voltage side logic circuit 120, for example. The low voltage side logic circuit 110 and the high voltage side logic circuit 120 are insulated from each other, and are operated with different potentials as references respectively. For example, when the low voltage side logic circuit 110 is operated with 0V as a reference, the high voltage side logic circuit 120 may be operated with from some ten volts to some kilovolts as a reference. It should be noted that the reference potential for the low voltage side logic circuit 110 here is relatively low compared to that for the high voltage side logic circuit 120, i.e. the low voltage side logic circuit 110 may be operated at a reference potential that is the same as for a circuit which the test apparatus 10 is equipped with.

In addition, different power supply voltages are supplied respectively to the low voltage side logic circuit 110 and the high voltage side logic circuit 120. For example, the low voltage side logic circuit 110 is provided with a power supply voltage of from some volts to some ten volts, with 0 volt as a reference. On the other hand, the high voltage side logic circuit 120 is for example provided with a power supply voltage of from some volts to some ten volts, with 1 kilovolt as a reference.

The test apparatus 10 tests the DUT 100. More specifically, the test apparatus 10 tests quality of the DUT 100 by detecting characteristic (e.g. power supply current value of the DUT 100) of the DUT when the power supply voltage $V_A$ supplied to the DUT 100 is changed. The DUT 100 is equipped with a reference voltage supply section 22, a field effect transistor 24, a voltage generating section 26, an inductance 28, a control section 30, a floating power supply section 32, a consumption current detection section 34, a test signal generating section 36, a driving section 38, a comparison section 40, and a judgment section 42.

The reference voltage supply section 22 supplies a reference voltage $V_R$ to the DUT 100. The reference voltage supply section 22 has a positive side terminal 61 and a negative side terminal 62, and generates the reference voltage $V_R$ between the positive side terminal 61 and the negative side terminal 62. The reference voltage supply section 22 supplies, between a positive-side power supply terminal and a negative-side power supply terminal of the DUT 100, the reference voltage $V_R$ having been generated between the positive side terminal 61 and the negative side terminal 62.

As an example, the positive side terminal 61 may be connected to the positive-side power supply terminal of the DUT 100, via the inductance 28, and the negative side terminal 62 may be directly connected to the negative-side power supply terminal of the DUT 100. Furthermore, when the DUT 100 has the low voltage side logic circuit 110 and the high voltage side logic circuit 120, the positive side terminal 61 may be connected to the power supply terminal of the high voltage side logic circuit 120, which functions as the positive-side power supply terminal of the DUT 100, and the negative side terminal 62 may be connected to a ground terminal of the DUT 100, which functions as the negative-side power supply terminal of the DUT 100, as an example. According to this, the high voltage side logic circuit 120 may be operated with, as a reference, a potential higher than the ground potential of the DUT 100 by an amount of the reference voltage $V_R$.

The field effect transistor 24 is provided between the positive side terminal 61 and the negative side terminal 62 of the reference voltage supply section 22, so that a drain terminal and a source terminal of the field effect transistor 24 are in parallel connection with the DUT 100. As an example, the drain terminal of the field effect transistor 24 may be connected to the positive side terminal 61 via the inductance 28, and the source terminal may be directly connected to the negative side terminal 62. In addition, the field effect transistor 24 may be a MOS (Metal Oxide Semiconductor) type field effect transistor, as an example. In addition, the test apparatus 10 may be equipped with a plurality of field effect transistors 24 which connect the source terminal and the drain terminal in cascade connection for the purpose of raising the voltage resistance, instead of being equipped with only one field effect transistor 24.

The voltage generating section 26 generates a control voltage $V_1$ to be supplied between the gate terminal and the source terminal of the field effect transistor 24. The inductance 28 is connected between the positive side terminal 61 and the negative side terminal 62 of the reference voltage supply section 22, the inductance 28 being in serial connection with the DUT 100 between the positive-side power supply terminal and the negative-side power supply terminal of the DUT 100, and being in serial connection with the field effect transistor 24 between the drain terminal and the source terminal of the field effect transistor 24.

The control section 30 controls the control voltage $V_1$ generated by the voltage generating section 26. The control voltage $V_1$ is supplied as a gate voltage of the field effect transistor 24. Consequently, by controlling the control voltage $V_1$, the control section 30 is able to control switching of the field effect transistor 24. Furthermore, because the source terminal and the drain terminal of the field effect transistor 24 are in parallel connection with the DUT 100 between the positive-side power supply terminal and the negative-side power supply terminal of the DUT 100, the power supply voltage $V_A$ supplied to the DUT 100 is changed by switching by the field effect transistor 24. In this way, by controlling the voltage generating section 26 so as to control the gate voltage of the field effect transistor 24, the control section 30 changes the power supply voltage $V_A$ to be supplied to the DUT 100. Moreover, the control section 30 may control the reference voltage $V_R$ generated by the reference voltage supply section 22, in addition to the above.

The floating power supply section 32 generates a power supply voltage whose objective is to drive the high voltage side logic circuit 120 within the DUT 100, with a potential of the positive side terminal 61 of the reference voltage supply section 22 as a reference. As one example, if the positive side terminal 61 of the reference voltage supply section 22 is brought to be connected to a sink side power supply terminal $V_s$ of the high voltage side logic circuit 120, the floating power supply section 32 generates a voltage (e.g. +15 volts or the like) whose reference is the sink side power supply terminal $V_s$ to be supplied to the source side power supply terminal $V_b$ of the high voltage side logic circuit 120.

The consumption current detection section 34 detects a power supply current value consumed by the DUT 100. The test signal generating section 36 outputs a test signal to be supplied to the DUT 100. The driving section 38 supplies, to the DUT 100, the test signal outputted from the test signal generating section 36. As an example, when the test signal is to be supplied to the high voltage side logic circuit 120, the driving section 38 converts the test signal to a signal whose reference voltage corresponds to the high voltage side logic circuit 120 by insulating between the input and the output, or the like.

The comparison section 40 obtains an output signal that the DUT 100 outputs in accordance with the test signal, and compares the obtained output signal with an expected value. As an example, when the output signal is obtained from the high voltage side logic circuit 120, the comparison section 40 converts the output signal into a signal whose reference voltage corresponds to the test apparatus 10 by insulating between the input and the output, or the like.

The judgment section 42 judges the quality of the DUT 100 based on a comparison result by the comparison section 40 or a consumption current value of the DUT 100 having been detected by the consumption current detection section 34, and the like. More specifically, the judgment section 42 judges the quality of the DUT 100, based on the characteristic of the DUT 100 in accordance with the change in the power supply voltage $V_A$ when the power supply voltage $V_A$ supplied to the DUT 100 is changed. As one example, the judgment section 42 may judge the quality of the DTU 100, based on the power supply current value consumed by the DUT 100 when the power supply voltage $V_A$ is changed.

Figure 2:
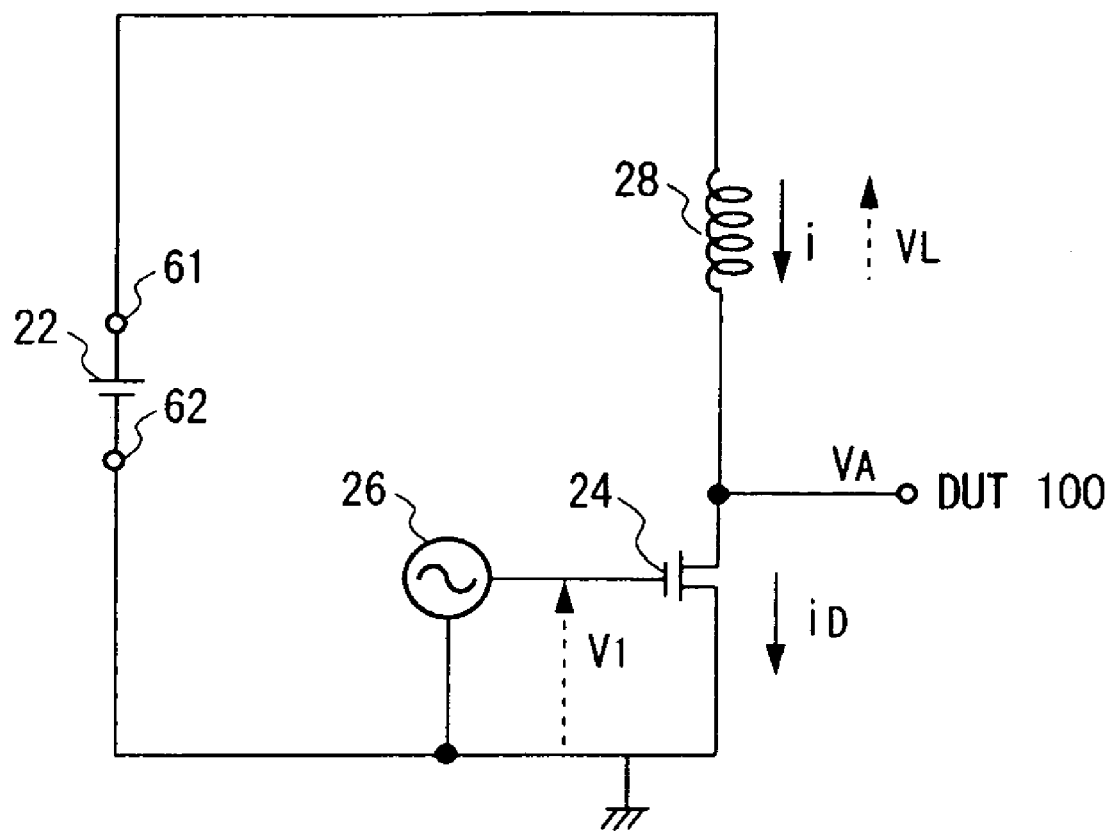
FIG. 2 shows a relation between voltage and current of a field effect transistor 24, a voltage generating section 26, and an inductance 28, which are included in the test apparatus 10 according to an embodiment of the present invention.

FIG. 2 shows voltage and current of the field effect transistor 24, the voltage generating section 26, and the inductance 28, which are included in the test apparatus 10 according to the present embodiment. It should be noted that FIG. 2 shows one example in which the negative side terminal 62 of the reference voltage supply section 22 and the negative-side power supply terminal of the DUT 100 are both connected to the ground potential (0 volt).

The power supply voltage $V_A$ supplied to the DUT 100 changes according to the switching state of the field effect transistor 24. More specifically, when the field effect transistor 24 is brought OFF in the normal state, the resistance value of the inductance 28 becomes substantially 0, and so the power supply voltage $V_A$ supplied to the DUT 100 becomes the reference voltage $V_R$ generated by the reference voltage supply section 22. On the contrary, when the field effect transistor 24 is brought ON in the normal state, the power supply voltage $V_A$ supplied to the DUT 100 becomes the ground potential (0 volt).

In addition, in the transition state in which the field effect transistor 24 changes from ON to OFF, or from OFF to ON, the inductance 28 generates an induction voltage. In such a case, if the voltage between terminals in the inductance 28 is represented as $V_L$, the power supply voltage $V_A$ supplied to the DUT 100 is represented as $V_R - V_L$. Accordingly, in the transition state in which the field effect transistor 24 changes from ON to OFF, or from OFF to ON, the power supply voltage $V_A$ changes in accordance with $V_L$.

Here, suppose the inductance 28 is L, and the current that runs through the inductance 28 is i. In addition, suppose that the drain current of the field effect transistor 24 is $i_D$, and the gate voltage of the field effect transistor 24 is $V_{GS}$. In this case, the impedance for the power-supply input terminal of the DUT 100 is extremely high, and so the current i that runs through the inductance 28 and the drain current $i_D$ become substantially the same as each other, and so the following equation (1) holds true:

$$i \approx i_D \quad (1)$$

In addition, the direct current voltage characteristic at the time of saturation of the MOS type field effect transistor is represented by the following equation (2).

$$i_D = \beta \times (V_{GS} - V_t)^2 / 2 \quad (2)$$

When the gate voltage $V_{GS}$ is sufficiently higher than the threshold voltage Vt of the MOS type field effect transistor, the equation (2) can be modified into the following equation (3) that indicates that the drain current $i_D$ is proportional to the gate voltage $V_{GS}$ squared.

$$i_D \propto (V_{GS})^2 \quad (3)$$

Furthermore, since $V_{GS} = V_1$, the equation (3) can be modified into the following equation (3)' that indicates that the drain current $i_D$ is proportional to the control voltage $V_i$ squared.

$$i_D \propto (V_1)^2 \quad (3)$$

On the other hand, as far as the inductance 28 is concerned, the voltage $V_L$ is a value obtained by multiplying, by the inductance, a differential value of the running current i squared. Consequently, the following equation (4) holds true.

$$V_L = L(di^2/dt) \quad (4)$$

Based on the equation (1), the equation (3)', and the equation (4), it becomes possible to derive the following equation (5) indicating that the voltage $V_L$ is a value obtained by multiplying, by the inductance, a differential value of the control voltage $V_1$ squared.

$$V_L \propto L(dV_1^2/dt) \quad (5)$$

Then by solving the differential equation of the equation (5), the following equation (6) can be derived.

$$V_L \propto LV_1 \quad (6)$$

The equation (6) means that when the inductance 28 has caused an induced electromotive force, the voltage between terminals $V_L$ in the inductance 28 is proportional to L and the control voltage $V_1$. As a consequence, since the power supply voltage $V_A = V_R - V_L$ during the transition state in which the field effect transistor 24 changes from ON to OFF or from OFF to ON, the control section 30 is able to control the gradient of the change in the power supply voltage $V_A$ by means of the control voltage $V_1$ (i.e. gate voltage $V_{GS}$ of the field effect transistor 24).

Figure 3A:
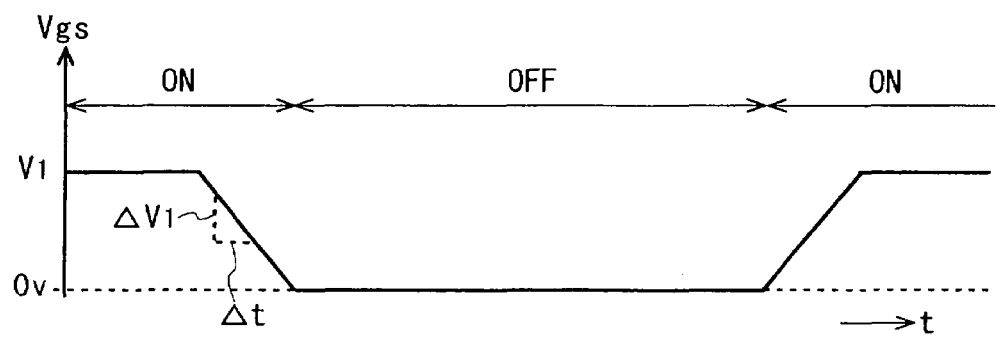
FIG. 3A shows one example of a waveform of a gate voltage supplied to the field effect transistor 24.
Figure 3B:
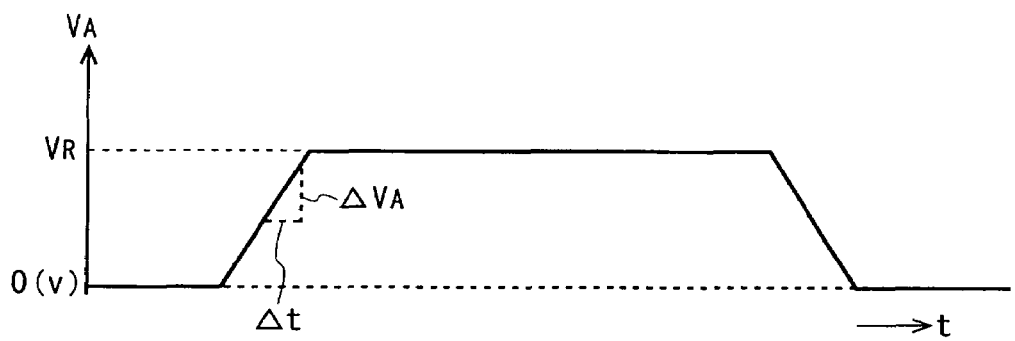
FIG. 3B shows one example of a waveform of a power supply voltage $V_A$ in case where the voltage of FIG. 3A is supplied to the field effect transistor 24.

FIG. 3A shows one example of a waveform of a gate voltage supplied to the field effect transistor 24. FIG. 3B shows one example of a waveform of the power supply voltage $V_A$ in case where the voltage of FIG. 3A is supplied to the field effect transistor 24. As shown in FIG. 3A, when the field effect transistor 24 is changed from ON to OFF, the control section 30 decreases the control voltage $V_1$ with a predetermined gradient ($\Delta V_1/\Delta t$). In this case, the power supply voltage $V_A$ is proportional to the control voltage $V_1$, and so the power supply voltage $V_A$ will increase with the gradient that is in accordance with the gradient of the control voltage $V_1$, i.e. ($\Delta V_A/\Delta t$), as shown in FIG. 3. In addition, when the control section 30 changes the size of the gradient of the control voltage $V_1$, the gradient of the power supply voltage $V_A$ changes accordingly.

Accordingly, in case of raising the power supply voltage $V_A$ to be supplied to the DUT 100, from the first reference voltage (e.g. 0 volt) to the second reference voltage (e.g. $V_R$) by changing the field effect transistor 24 from ON to OFF, the control section 30 is able to increase the power supply voltage $V_A$ with a gradient designated in advance, by gradually decreasing the control voltage $V_1$ thereby decreasing a gate voltage.

In addition, in case of changing the field effect transistor 24 from OFF to ON as shown in FIG. 3A, the control section 30 may increase the control voltage $V_1$ with a gradient designated in advance. In this case too, the power supply voltage $V_A$ is proportional to the control voltage $V_1$, and so the power supply voltage $V_A$ decreases with a gradient that is in accordance with the gradient for the control voltage $V_1$, as shown in FIG. 3B. In addition, when the control section 30 changes the size of the gradient for the control voltage $V_1$, the gradient of the power supply voltage $V_A$ changes accordingly.

Accordingly, in case of lowering the power supply voltage $V_A$ to be supplied to the DUT 100, from the second reference voltage (e.g. $V_R$) to the first reference voltage (e.g. 0 volt) by changing the field effect transistor 24 from OFF to ON, the control section 30 is able to decrease the power supply voltage $V_A$ with a gradient designated in advance, by gradually increasing the control voltage $V_1$ thereby increasing the gate voltage.

The test apparatus 10 controls the gradient for the change in the power supply voltage $V_A$ in the above way, thereby enabling the characteristic of the DUT 100 to be detected. Consequently, the test apparatus 10 becomes able to detect a defect attributable to a size of the gradient of the power supply voltage $V_A$ to be supplied to the DUT 100, with high reproducibility. In addition, when changing the control voltage $V_1$ with a predetermined gradient ($\Delta V_1/\Delta t$), the test apparatus 10 may perform control by designating a peak value of the control voltage $V_1$ and a period between 0 and the peak value.

For example, when the insulating section of the DUT 100 that corresponds to high voltage has a large capacity above a certain level, and when the gradient of the rising of the power supply voltage $V_A$ becomes a predetermined value or above, a large consumption current runs therethrough and so the DUT 100 is detected as a defect. The test apparatus 10 is able to set a gradient designated in advance as a gradient for the change in the power supply voltage $V_A$, and so reproducibility for the defect detection is improved in case of detecting a defect attributable to the gradient of the power supply voltage $V_A$.

Figure 4:
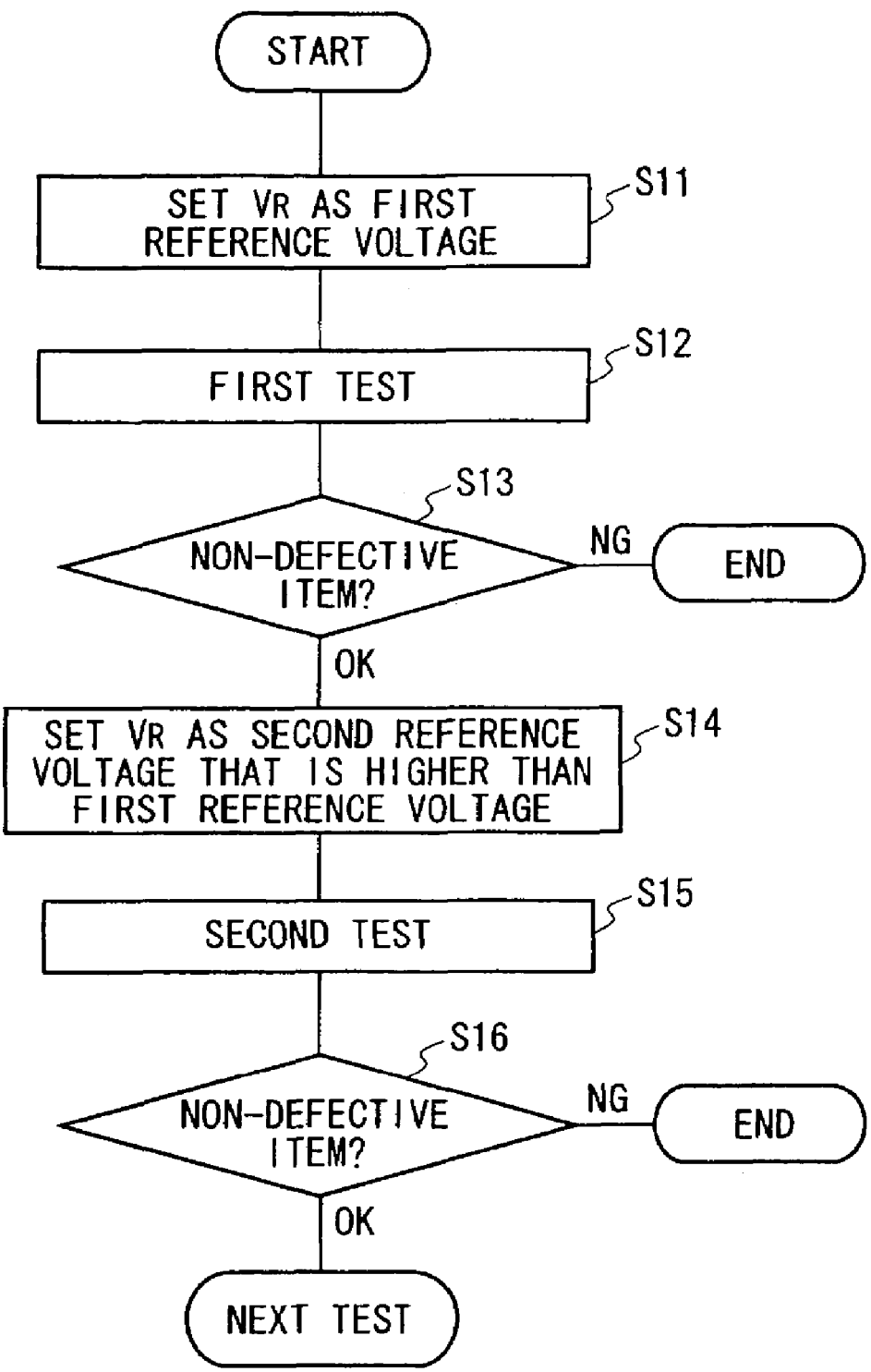
FIG. 4 shows one example of a test procedure performed by the test apparatus 10 according to an embodiment of the present invention.

FIG. 4 shows one example of a test procedure performed by the test apparatus 10 according to the present embodiment. First, the control section 30 sets, as a first reference voltage, a reference voltage $V_R$ generated by the reference voltage supply section 22 (Step S11). Next, while keeping the first reference voltage supplied from the reference voltage supply section 22, the control section 30 gradually decreases the control voltage $V_1$ and conducts the first test in which the power supply voltage $V_A$ to be supplied to the DUT 100 is raised from the first power supply voltage to the second power supply voltage (Step S12). During the first test, the consumption current detection section 34 may detect a consumption current value of the DUT 100.

Next, during the first test, the judgment section 42 judges whether the DUT 100 is a non-defective item, based on the consumption current value detected by the consumption current detection section 34 for example (Step S13). When the DUT 100 is judged not to be a non-defective item, i.e. when a defect has been detected (Step S13: NG), the judgment section 42 ends the processing. When the DUT 100 is judged to be a non-defective item, i.e. when a defect has not been detected (Step S13: OK), the judgment section 42 proceeds to Step S14.

Next, on condition that the DUT 100 has not been detected as a defective item as a result of the first test, the control section 30 sets the reference voltage $V_R$ generated by the reference voltage supply section 22, to the second reference voltage that is higher than the first reference voltage (Step S14). Next, while keeping the second reference voltage supplied from the reference voltage supply section 22, the control section 30 gradually decreases the control voltage $V_1$ and conducts the second test in which the power supply voltage $V_A$ to be supplied to the DUT 100 is raised from the voltage value substantially the same as that of the first power supply voltage to the third power supply voltage that is higher than the second power supply voltage (Step S15). During the second test, the consumption current detection section 34 may detect a consumption current value of the DUT 100.

Next, during the second test, the judgment section 42 judges whether the DUT 100 is a non-defective item, based on the consumption current value detected by the consumption current detection section 34 for example (Step S16). When the DUT 100 is judged not to be a non-defective item (Step S16: NG), the judgment section 42 ends the processing. When the DUT 100 is judged to be a non-defective item (Step S16: OK), the judgment section 42 proceeds to a next different test, for example.

As described above, the test apparatus 10 first conducts a test while keeping a relatively low reference voltage $V_R$ supplied from the reference voltage supply section 22, and then conducts a second test while keeping a high reference voltage $V_R$ supplied from the reference voltage supply section 22. Consequently, it becomes possible to exclude defective DUT 100 prior to application of a power supply voltage $V_A$ that is of a high voltage. Accordingly, it becomes possible to prevent application of large current and the like to defective DUT 100 due to application of high voltage thereto, thereby lessening the burden on the test apparatus 10.

Figure 5:
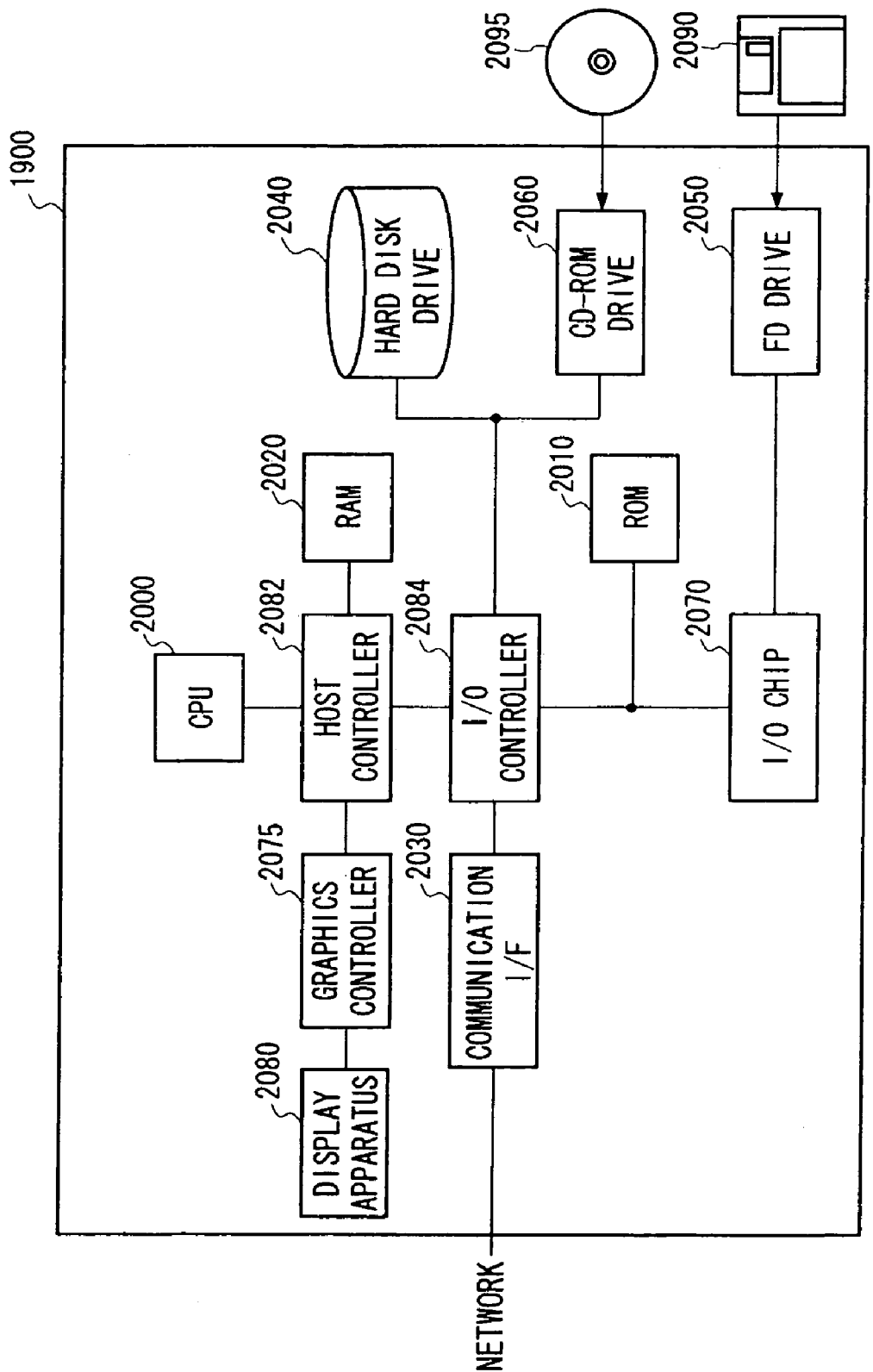
FIG. 5 is a diagram showing one example of a hardware configuration of a computer 1900 according to an embodiment of the present invention.

FIG. 5 is a diagram showing one example of a hardware configuration of a computer 1900 according to the present embodiment. The computer 1900 according to the present embodiment is equipped with a CPU periphery that includes a CPU 2000, a RAM 2020, a graphics controller 2075, and a display apparatus 2080 which are mutually connected by a host controller 2082. The computer 1900 is also equipped with an input/output unit having a communication interface 2030, a hard disk drive 2040, and a CD-ROM drive 2060 which are connected to the host controller 2082 via an input/output controller 2084, and a legacy input/output unit having a ROM 2010, a flexible disk drive 2050, and an input/output chip 2070 which are connected to the input/output controller 2084.

The host controller 2082 connects the RAM 2020 with the CPU 2000 and the graphics controller 2075 which access the RAM 2020 at a high transfer rate. The CPU 2000 operates according to programs stored in the ROM 2010 and the RAM 2020, thereby controlling each unit. The graphics controller 2075 obtains image data generated by the CPU 2000 or the like on a frame buffer provided in the RAM 2020, and causes the image data to be displayed on the display apparatus 2080. Alternatively, the graphics controller 2075 may contain therein a frame buffer for storing image data generated by the CPU 2000 or the like.

The input/output controller 2084 connects the host controller 2082 with the communication interface 2030, the hard disk drive 2040, and the CD-ROM drive 2060, which are relatively high-speed input/output apparatuses. The communication interface 2030 communicates with other apparatuses via a network. The hard disk drive 2040 stores a program and data used by the CPU 2000 within the computer 1900. The CD-ROM drive 2060 reads the program or the data from the CD-ROM 2095, and provides the hard disk drive 2040 with the program or the data via the RAM 2020.

The ROM 2010, and the flexible disk drive 2050 and the input/output chip 2070 which are relatively low-speed input/output apparatuses are connected to the input/output controller 2084. The ROM 2010 stores therein a boot program executed by the computer 1900 at the time of activation, a program depending on the hardware of the computer 1900, or the like. The flexible disk drive 2050 reads the programs or data from a flexible disk 2090, and provides the hard disk drive 2040 with the programs or data via the RAM 2020. The input/output chip 2070 connects various input/output apparatuses via the flexible disk drive 2050, and a parallel port, a serial port, a keyboard port, a mouse port, and the like.

A program to be provided for the hard disk drive 2040 via the RAM 2020 is provided by a user by being stored in such a recording medium as the flexible disk 2090, the CD-ROM 2095, and an IC card. The program is read from the recording medium, installed into the hard disk drive 2040 within the computer 1900 via the RAM 2020, and executed in the CPU 2000.

A program that is installed in the computer 1900 and causes the computer 1900 to function as a control apparatus of the test apparatus 10 has a control section module and a judgment section module. These program or modules act on the CPU 2000 and so on, to cause the computer 1900 to function as the control section 30 and the judgment section 42 respectively.

The programs or modules described above may be stored in an external recording medium. The recording medium may be, besides the flexible disk 2090 and the CD-ROM 2095, an optical recording medium such as a DVD and a CD, a magneto-optical recording medium such as an MO, a tape medium, a semiconductor memory such as an IC card. In addition, it is also possible to use, as the recording medium, a recording apparatus such as a hard disk or a RAM provided in a server system connected to a dedicated communication network or the Internet, for the purpose of providing a program to the computer 1900 via the network.

In the above, the present invention has been described by way of an exemplary embodiment. However, it is needless to say that the technical scope of the present invention should not be limited by the above-described embodiment. It should be understood that those skilled in the art might make many changes and substitutions without departing from the spirit and the scope of the present invention. It is obvious from the appended claims that embodiments with such modifications also belong to the scope of the present invention.

According to the present invention, it becomes possible to test a device under test, by controlling a change in power supply voltage to be supplied to the device under test.

The invention claimed is:

1. A test apparatus for testing a device under test, the test apparatus comprising:

a reference voltage supply section for supplying a reference voltage;

a field effect transistor provided between a positive side terminal and a negative side terminal of the reference voltage supply section so that a drain terminal and a source terminal of the field effect transistor are in parallel connection with the device under test;

an inductance that is connected between the positive side terminal and the negative side terminal of the reference voltage supply section, the inductance being in serial connection with the device under test between a positive-side power supply terminal and a negative-side power supply terminal of the device under test, and being in serial connection with the field effect transistor between the drain terminal and the source terminal of the field effect transistor;

a control section for controlling a gate voltage of the field effect transistor, thereby changing a power supply voltage to be supplied to the device under test; and a judgment section for judging quality of the device under test, based on characteristic of the device under test in accordance with change in the power supply voltage.

2. The test apparatus as set forth in claim 1, wherein the judgment section judges the quality of the device under test, based on a power supply current value consumed by the device under test when the power supply voltage is changed.

3. The test apparatus as set forth in claim 1, wherein the control section, by decreasing the gate voltage, increases the power supply voltage with a gradient designated in advance.

4. The test apparatus as set forth in claim 1, wherein the control section conducts a first test in which the power supply voltage is raised from a first power supply voltage to a second power supply voltage while keeping the first reference voltage supplied from the reference voltage supply section, and on condition that no defect for the device under test is found in the first test, the control section conducts a second test in which the power supply voltage is raised from a voltage value substantially the same as a voltage value of the first power supply voltage to a third power supply voltage that is higher than the second power supply voltage, while keeping the second reference voltage supplied from the reference voltage supply section, the second reference voltage being higher than the first reference voltage.

5. A test method for testing a device under test by means of a test apparatus, the test apparatus including:

a reference voltage supply section for supplying a reference voltage;

a field effect transistor provided between a positive side terminal and a negative side terminal of the reference voltage supply section, so that a drain terminal and a source terminal of the field effect transistor are in parallel connection with the device under test; and an inductance that is connected between the positive side terminal and the negative side terminal of the reference voltage supply section, the inductance being in serial connection with the device under test between a positive-side power supply terminal and a negative-side power supply terminal of the device under test, and being in serial connection with the field effect transistor between the drain terminal and the source terminal of the field effect transistor, the test method comprising:

a control step for controlling a gate voltage of the field effect transistor, thereby changing a power supply voltage to be supplied to the device under test; and a judgment step for judging quality of the device under test, based on characteristic of the device under test in accordance with change in the power supply voltage.

* * * * *